(12) United States Patent
Mann et al.

(10) Patent No.: US 9,545,023 B2
(45) Date of Patent: Jan. 10, 2017

(54) CABINET FOR HOUSING ELECTRONIC PLUG-IN CARDS AND METHOD OF ASSEMBLY

(71) Applicant: Schroff GmbH, Straubenhardt (DE)

(72) Inventors: Dietmar Mann, Remchingen (DE); Sergej Dizel, Karlsruhe (DE); Dietmar Gauges, Walzbachtal (DE); Jochen Müller, Engelsbrand (DE)

(73) Assignee: Pentair Technical Solutions GMBH, Straubenhardt (DE)

( * ) Notice: Subject to any disclaimer, the term of this patent is extended or adjusted under 35 U.S.C. 154(b) by 280 days.

(21) Appl. No.: 14/322,538

(22) Filed: Jul. 2, 2014

(65) Prior Publication Data
US 2015/0008806 A1 Jan. 8, 2015

(30) Foreign Application Priority Data

Jul. 5, 2013 (EP) .................................... 13175312

(51) Int. Cl.
| | |
|---|---|
| *H05K 7/14* | (2006.01) |
| *H05K 7/18* | (2006.01) |
| *H05K 5/02* | (2006.01) |
| *H05K 1/14* | (2006.01) |

(52) U.S. Cl.
CPC ............ *H05K 5/0256* (2013.01); *H05K 1/144* (2013.01); *H05K 7/1427* (2013.01); *H05K 7/1445* (2013.01); *H05K 2201/042* (2013.01); *H05K 2201/044* (2013.01); *H05K 2201/09036* (2013.01); *H05K 2201/10409* (2013.01); *H05K 2201/2036* (2013.01); *Y10T 29/53183* (2015.01)

(58) Field of Classification Search
CPC .. H05K 1/14; H05K 2201/044; H05K 7/1425; H05K 7/1418
USPC .................................. 361/788, 792, 795–802
See application file for complete search history.

(56) References Cited

U.S. PATENT DOCUMENTS

| | | | |
|---|---|---|---|
| 6,795,301 B2 * | 9/2004 | Cox ...................... | H05K 7/1425 312/223.4 |
| 7,180,751 B1 * | 2/2007 | Geschke ............ | H01R 13/6658 361/758 |
| 7,239,528 B1 | 7/2007 | McLeod | |

(Continued)

OTHER PUBLICATIONS

Ray Larsen, "Progress in Advanced TCA for Instrumentation," ATCA Summit 2012, Sep. 19, 2012, p. 11.

(Continued)

*Primary Examiner* — Tuan T Dinh
(74) *Attorney, Agent, or Firm* — Quarles & Brady LLP

(57) ABSTRACT

A cabinet for housing electronic plug-in cards has front and rear card baskets for inserting plug-in cards and first and second vertical backplanes. The front side of the first backplane faces the front of the cabinet and the front side of the second backplane faces the back of the cabinet. A distance piece connects the two backplanes and a counterbore is disposed in at least one of the rear sides of the two backplanes. The depth of the counterbore or the residual thicknesses of the backplane after drilling the counterbore is sized such that the distance between the front side of the second backplane and the front of the cabinet is a predetermined value. This ensures that the plug-in cards pushed onto the second backplane are completely received inside the rear card basket and the front plate of the plug-in cards ends flush with the rear card basket.

14 Claims, 2 Drawing Sheets

(56) References Cited

U.S. PATENT DOCUMENTS

2013/0329392 A1* 12/2013 Czuba .................. H05K 7/1445
361/784
2014/0307375 A1* 10/2014 Mann ........................ G06F 1/20
361/679.02

OTHER PUBLICATIONS

Eike Waltz, "ATCA Summit 2011, Advanced TCA Extensions PICMG 3.7 Mechanical," Nov. 2, 2012, p. 10.

* cited by examiner

CABINET FOR HOUSING ELECTRONIC PLUG-IN CARDS AND METHOD OF ASSEMBLY

RELATED APPLICATIONS

This application claims priority to EP 13 175 312.1, filed Jul. 5, 2013, the entire disclosure of which is hereby incorporated herein by reference.

BACKGROUND

The invention relates to a cabinet for housing electronic plug-in cards that have a front, a back, a front card basket for inserting plug-in cards from the front and a rear card basket for inserting plug-in cards from the back. The cabinet further comprises a first vertical backplane with a front side and a rear side, wherein the first backplane is attached to the end of the front card basket such that its front side points to the front of the cabinet, and a second backplane with a front side and a rear side, wherein the second backplane is arranged in parallel and at a distance on the rear side of the first backplane such that the front side of the second backplane points to the back of the cabinet. Distance pieces connect the two backplanes with each other.

Such a cabinet is used for modular computer systems in the telecommunications industry. According to new or future standards for such modular computer systems such as Advanced TCA Extension, the rear card basket has the same size as the front card basket. As a result plug-in cards of the same size can be housed both in the front and in the rear card basket.

When installing the electronic components the first vertical backplane is initially screwed to the housing. Thereafter the second backplane is attached to the rear side of the first backplane by means of distance pieces. Then the plug-in cards are pushed onto the first or the second backplane in the front and the rear card basket.

When manufacturing the backplanes their thickness is subject to a manufacturing tolerance of approx. ±10%. Since the length of the distance pieces is also subject to a certain manufacturing tolerance, the distance between the front sides of the two backplanes mounted on top of each other comprises a correspondingly large overall tolerance. This tolerance is not acceptable for the majority of applications.

Due to the overall tolerance the mounting position of the second backplane in the cabinet varies considerably. When for example plug-in modules are pushed onto the second backplane, the varying overall tolerance in the worst case can have the effect of some plug-in cards protruding from the rear card basket. The front plates of the plug-in modules do then not finish flush with the rear card basket. As a result the cabinet may not be correctly closed on its back.

The document "Progress in Advanced TCA for Instrumentation, ATCA Summit 2012", on page 11 describes an arrangement of two backplanes, wherein the second backplane is attached on top of the first backplane with the aid of distance pieces. Both the first and the second backplane have plug-in cards of the same size inserted into them. Page 11 also shows cabinets into which such an arrangement is installed.

The document "ATCA Summit 2011, Advanced TCA Extensions PICMG 3.7 Mechanical", 2 Nov. 2012, Eike Waltz, on page 10 discloses a cabinet with two backplanes. The cabinet comprises a front and a rear card basket, wherein both card baskets are of the same size.

U.S. Pat. No. 7,239,528 B1 discloses a cabinet with a front card basket, a rear card basket and a midplane. The midplane is attached to the front card basket, which by means of connecting pieces is connected with the rear card basket. The connecting pieces comprise elongated slots by means of which the rear card basket can be moved relative to the front card basket. Variations in the thickness of the midplane can thus be compensated for by adjusting the rear card basket. This ensures that independently of the thickness tolerance of the midplane, plug-in cards mounted in the rear card basket cannot not protrude from the rear card basket.

SUMMARY

In view of the described problem this disclosure teaches an improved cabinet, where the plug-in cards installed in the rear card basket do not protrude from the card basket notwithstanding the manufacturing tolerances of individual backplanes.

According to this disclosure at least two facing rear sides of the two parallel backplanes have plane or flat counterbores provided in them, wherein the distance pieces are in contact with the bottom of the counterbores. The depths of the counterbores or the residual thickness of the backplanes are chosen such that the distance between the front side of the second backplane and the front of the cabinet corresponds to a predefined value. The front of the cabinet is formed by the partial front plates of the plug-in modules, the plug-in cards of which are pushed onto the first backplane. As an alternative the depth of the counterbores could be chosen such that the distance between the front side of the second backplane and a stop surface, at which the front plates come to a stop at the front card basket, corresponds to a predefined value; this distance is reduced only by the thickness of the front plates.

Said predefined value is chosen such that the plug-in cards pushed onto the second backplane are completely received in the rear card basket and the front plates of the plug-in cards finish flush with the rear card basket. This is achieved in that the distance between the front side of the second backplane and the back of the cabinet is dimensioned so as to be sufficiently large. The back of the cabinet is formed by the partial front plates of the plug-in modules, the plug-in cards of which are pushed onto the second backplane. As an alternative to the above-defined distance, it is possible to choose a sufficiently large dimension for the distance between the front side of the second backplane and a stop surface against which the front plates come to a stop at the rear card basket.

For example, prior to fitting the backplanes into the cabinet the thicknesses of the backplanes and the length of the distance pieces could be measured. Based on these measurements the overall tolerance of these components is then determined. Depending upon the position of the attachment points in the cabinet, to which the first backplane is attached, the depth of the counterbores to be manufactured can be calculated. In this way it is possible to position the front of the second backplane in the cabinet at very small tolerances. This makes it possible to ensure adherence to a predefined distance between the front side of the second backplane and the front of the cabinet. At the same time a sufficient distance is ensured between the front side of the second backplane and the back of the cabinet.

Alternatively, independently of the actual depth of the backplanes, the counterbores may be drilled to a depth which ensures that a predetermined residual thickness of the backplanes is maintained. The residual thickness is chosen in advance depending upon the dimensions of the cabinet and the position of the attachment points in the cabinet for attaching the first backplane. These dimensions are subject to a relatively narrow tolerance thereby allowing the calculated residual thickness to be used, as a rule, for further cabinets of the same type. Also the chosen residual thickness ensures that the maximum distance between the front side of the second backplane and the front of the cabinet is maintained.

Preferably both backplanes comprise counterbores on the rear sides, which face each other thus enabling a major overall tolerance to be compensated for by means of the counterbores. If the overall tolerance remains the same, the depths of the counterbores can be reduced. A weakening of the stability of the backplanes due to the counterbores is thereby minimized.

In one embodiment each distance piece comprises a connecting portion with two opposing circular contact surfaces for contacting the facing rear sides of the backplanes. The connecting portion is a means for connecting the two backplanes arranged in parallel with each other. Preferably the inner diameters of the counterbores are chosen to be larger than the dimensions of the distance pieces in the region of the contact surfaces. If the distance pieces are shaped cylindrically, the outer diameters of the distance pieces are conveniently smaller than the inner diameters of the counterbores. This ensures that the contact surfaces reach the bottom of the counterbores unhindered; tilting of the distance pieces during insertion into the counterbores is avoided. Due to the defined contact surfaces the distance pieces are accurately aligned at right angles relative to the backplanes.

Optionally both backplanes are electrically connected with each other via the distance pieces. It is understood that the distance pieces in this case consist of an electrically conducting material, preferably metal. If, for example, the first backplane is supplied via a power supply with a supply voltage, this can be passed on to the second backplane via the electrical connection between the two backplanes. Additional cables or connecting plugs on the second backplane are not necessary.

It is advantageous if both backplanes comprise through-holes, which are arranged concentrically to the counterbores. This allows the two backplanes to be mechanically connected with each other via the distance pieces. The second backplane can thus be securely fastened to the first backplane.

Preferably electrically conducting circular contact surfaces (eyes) are arranged concentrically to the through-holes at least on the two front sides of the backplanes. The electrical connection of the two backplanes is then effected by means of metallic washers, which come to rest against the contact surfaces. The distance pieces are brought into contact with the washers, thereby establishing the electrical connection between the two backplanes. The alternative to this would be to design the through-holes with a through-connection.

A further optional feature is that the distance pieces are configured as distance bolts, which respectively comprise two threaded portions after the connecting portions with a diameter which is reduced relative to the connecting portion. The distance pieces may be implemented as turned parts, which can be manufactured at low cost. The electrical connection of the backplanes via the distance bolts may be effected by optionally manufacturing the distance bolts from an electrically conducting material. Due to the stepped diameters a shoulder is present at the transitions from a connecting portion to the threaded portions, and the contact surfaces are formed on this shoulder. Optionally the threaded portions comprise external threads. It is also feasible, however, to provide internal threads.

In one exemplary embodiment the two threaded portions of a distance piece extend starting from the rear sides of both backplanes through the through-holes. The threaded portions may extend beyond the front side of the two backplanes. Washers and nuts can be pushed or screwed onto the external threads of the threaded portions thus clamping the backplanes between the connecting portion and the respective nut. The diameters of the threaded portions are, for example, chosen such that they come into contact with the washers. In the case of through-holes with a through-connection the diameters of the threaded portions may be chosen such that they come into contact with the inside wall of the connected-through through-holes. This again ensures that an electrical connection exists between the two backplanes.

It would also be feasible, however, for the threaded portions to finish flush or approximately flush with the front sides of the backplanes. The threaded portions would then comprise internal threads into which screws are screwed from the front side of the backplanes. With both alternatives a safe connection of the backplanes is ensured by means of the distance pieces.

With a further embodiment the distance pieces comprise internal threads at their contact surfaces. Preferably the distance pieces are shaped as cylinders, whereby the contact surfaces for making contact with the rear sides of the two backplanes are provided at the longitudinal ends of these cylinders.

It is convenient that fastening means are provided, which starting from the front sides of the backplanes extend through the through-holes and engage in the internal threads of the distance pieces. Preferably the fastening means are implemented as screws, which either directly or via washers, make contact with the electrically conducting surfaces. An electrical connection of the two backplanes is then established via the washers, the screws and the distance pieces, into which the screws have been screwed.

Optionally the distance pieces are shaped as sleeves, through each of which a threaded rod extends. Both threaded rods and distance pieces are available as purchased parts thereby avoiding any additional labor involving machining the sleeves and/or the threaded rods. Sleeves and threaded rods thus represent a particularly cost-effective way of realizing the distance pieces.

Preferably the threaded rods extend on either side starting from the rear sides of the backplane through the through-holes. For example the threaded rods are passed through the sleeves and then inserted into the through-holes of the two backplanes. Fastening of the threaded rods to the two backplanes is then effected by means of nuts, which are screwed onto the threaded rods thereby clamping the backplanes between the sleeve and the respective nut.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein.

DETAILED DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of the present invention.

In this disclosure, terms such as "vertical," "parallel," "horizontal," "flat," round," "rectangular" and the like are used to describe the orientation, position or general shape of structural elements disclosed herein. As would be readily recognized by one of ordinary skill, it shall be understood for purposes of this disclosure and claims that these terms are not used to connote exact mathematical orientations or geometries, unless explicitly stated, but are instead used as terms of approximation. With this understanding, the term "vertical," for example, certainly includes a structure that is positioned exactly 90 degrees from horizontal, but should generally be understood as meaning positioned up and down rather than side to side. Other terms used herein to connote orientation, position or shape should be similarly interpreted.

Further, it should be understood that various structural terms used throughout this disclosure and claims should not receive a singular interpretation unless it is made explicit herein. By way of example, the terms "backplane," "counterbore," and "distance piece," to name just a few, should be interpreted when appearing in this disclosure and claims to mean one or more. All other terms used herein should be similarly interpreted unless it is made explicit that a singular interpretation is intended.

Figure 1:
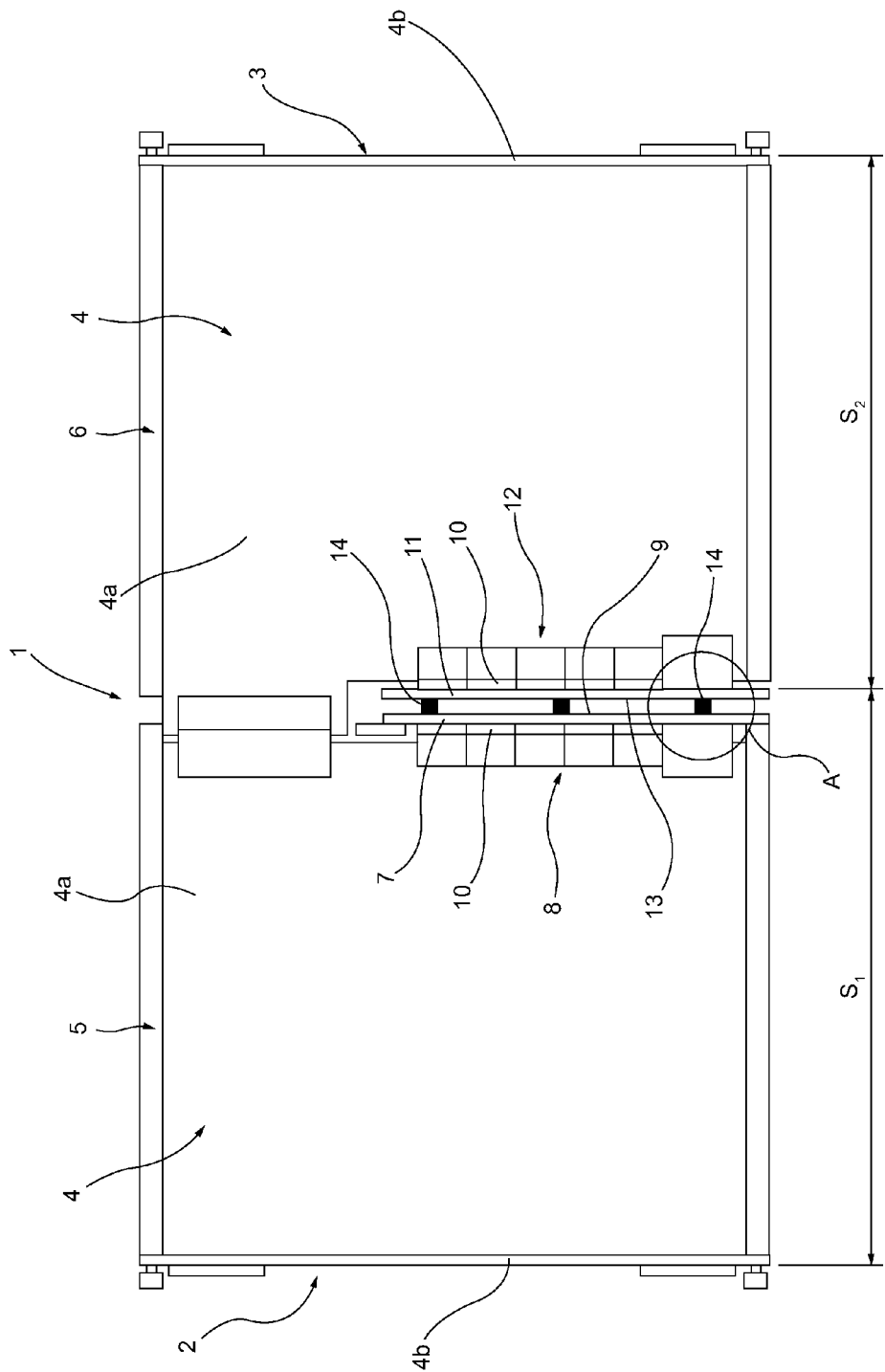
FIG. 1 shows a vertical section through a cabinet with two parallel backplanes which are connected with each other via distance pieces.

FIG. 1 shows a cabinet 1 with a front 2 and a back 3. The cabinet 1 is used to house electronic plug-in modules 4 comprising plug-in cards 4a and front plates 4b. The front plates 4b are connected with the cabinet 1 so that the front plates 4b form the front 2 and the back 3 of the cabinet 1.

The cabinet 1 comprises a front card basket 5 for inserting plug-in cards 4a from the front 2 and a rear card basket 6 for inserting plug-in cards 4a from the back 3.

At the end of the front card basket 5 is arranged a first backplane 7 having a front side 8 and rear side 9. The first backplane 7 comprises plugs 10 on the front side 8 for inserting the plug-in cards 4a in the front card basket 5. The first backplane 7 is vertically fastened in the cabinet 1 in such a manner that its front side 8 points towards the front 2 of the cabinet 1.

A second backplane 11 is arranged in parallel with the first backplane 7 and at a distance from the same, on the rear side 9 of the first backplane 7. The second backplane 11 also comprises a front side 12 and a rear side 13. Further plugs 10 are arranged on the front side 12 of the second backplane 11 and these are provided for receiving the plug-in cards 4a present in the rear card basket 6. The second backplane 11 is arranged in the cabinet 1 in such a manner that its front side 12 points towards the back 3 of the cabinet 1.

The front side 12 of the second backplane 11 is arranged at a distance $s_1$ from the front 2 of cabinet 1. The size of the distance $s_1$ is dependent on a distance $s_2$, which extends between the front side 12 of the second backplane 11 and the back 3 of the cabinet 1. The distance $s_2$ is chosen such that the plug-in cards 4a can be pushed from the back 3 of the cabinet 1 into the plugs 10 of the second backplane 11 and are received completely within the space of the rear card basket 6. The plug-in cards 4a do not protrude from the rear card basket 6, thus allowing the front plates 4b to finish flush with the rear card basket 6.

Figure 2:
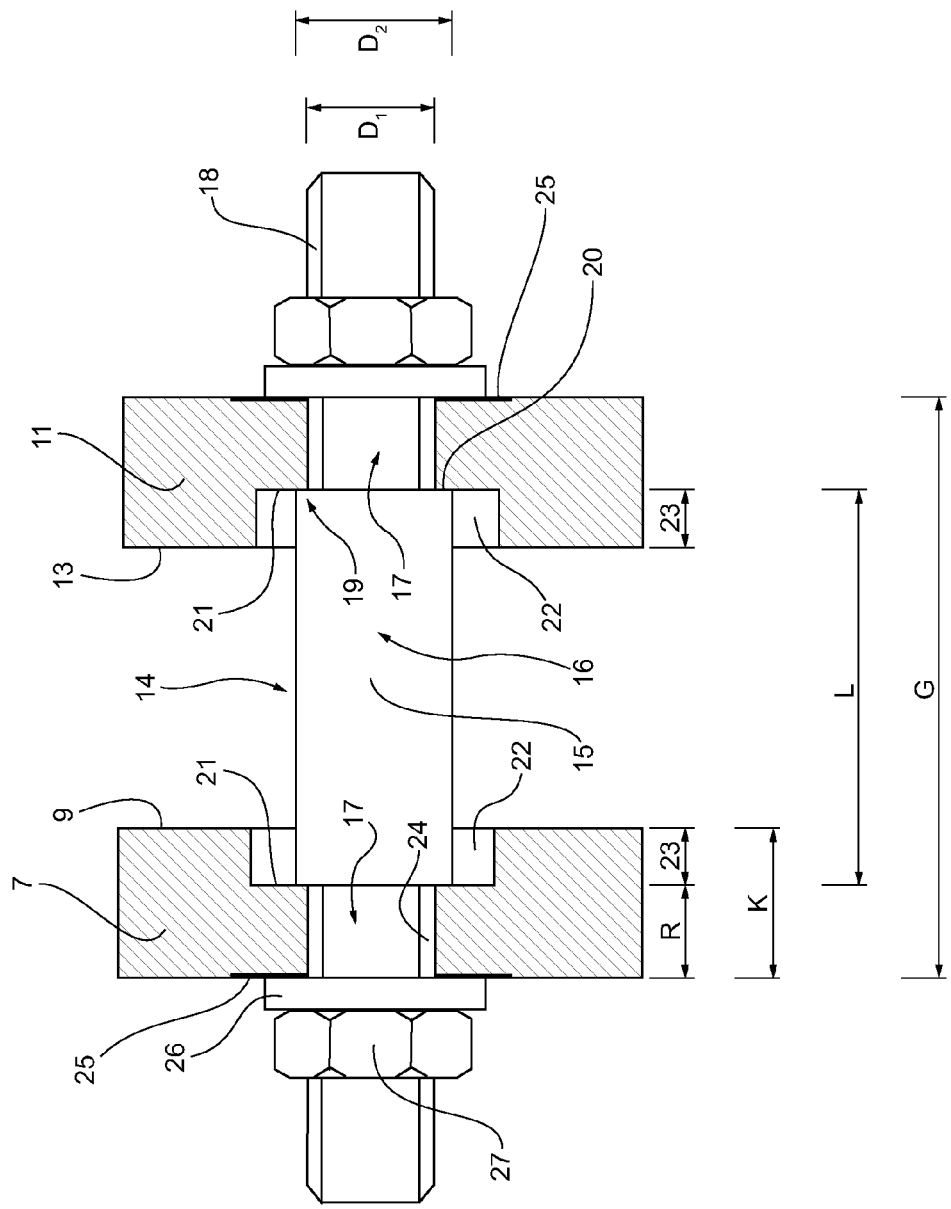
FIG. 2 shows a detail view A of a distance piece of FIG. 1.

The cabinet 1 further comprises distance pieces 14 which connect the two backplanes 7, 11 with each other both mechanically and electrically. FIG. 2 shows such a distance piece 14 in detail (region A in FIG. 1).

The distance piece 14 is configured as a distance bolt 15. It comprises a connecting portion 16 and two threaded portions 17 with external threads 18 on either side after the connecting portion 16. The diameter $D_1$ of the threaded portions 17 is smaller than the diameter $D_2$ of the connecting portion 16. Shoulders 19 are arranged at the transitions from the connecting portion 16 to the threaded portions 17, and this is where the opposing circular contact surfaces 20 are formed.

The contact surfaces 20 make contact with the flat bottom 21 of plane counterbores 22. The counterbores 22 are provided at the rear sides 9, 13 of the two backplanes 7, 11 facing each other, and have a depth 23. The depths 23 of the counterbores 22 are chosen such that the distance $s_1$ (FIG. 1) between the front side 12 of the second backplane 11 and the front 2 of the cabinet 1 has a predetermined value. The predetermined value is chosen so as to ensure that the plug-in cards 4a inserted into the second backplane 11 are securely positioned inside the rear card basket 6 and do not protrude from the same. This means that the distance $s_2$ (FIG. 1) between the front side 12 of the second backplane 11 and the back 3 of the cabinet 1 must be sufficiently large.

It is also feasible, however, for only one of the two backplanes 7, 11 to comprise counterbores 22. In this case only one of the two contact surfaces 20 would make contact with the bottom 21 of the counterbore 22. The depth of this counterbore 22 therefore has to be chosen such that the distance $s_1$ (FIG. 1) corresponds to a predetermined value. The opposite contact surface 20 of the distance piece 14 would make contact with an opposite rear side 9, 13 of one of the two backplanes 7, 11.

Through-holes 24 in the two backplanes 7, 11 are provided concentrically to the counterbores 22. The front sides 8, 12 of the two backplanes 7, 11 have electrically conducting contact surfaces (eyes) 25 arranged on them, which extend concentrically to the through-holes 24.

The threaded portions 17 of the distance bolt 15 extend starting from the rear sides 9, 13 of the two backplanes 7, 11 through the through-holes 24. Washers 26 and nuts 27 are pushed or screwed onto the threaded portions 17 from the front sides 8, 12 of the two backplanes 7, 11. The washers 26 are in contact with the contact surfaces 25 and at the same time also touch the threaded portions 17. By tightening the nuts 27 the two backplanes 7, 11 are clamped between the distance bolt 15 and the respective nut 27.

The electrical connection of the two backplanes 7, 11 is established by the threaded portions 17 and thus the distance pieces 14 coming into contact with the contact surfaces 25 via the washers 26. It is understood that the distance pieces 14 consist of an electrically conducting material, preferably of metal.

It is also feasible that the distance pieces 14 comprise internal threads on their contact surfaces 20. The two backplanes 6, 11 are then connected via distance pieces 14 by means of screws which starting from the front sides 8, 12 of the backplanes 7, 11 extend through the through-holes 24 and engage in the internal threads of the distance pieces 14.

Alternatively the distance pieces 14 may be configured as sleeves, through each of which a threaded rod extends. When assembled the threaded rods extend from the rear sides 9, 13 of the two backplanes 7, 11 through the through-holes 24. On the front sides 8, 12 of the two backplanes 7, 11 washers 26 and nuts 27 are pushed or screwed onto the threaded rod so that the backplanes 7, 11 are clamped between the sleeve and the respective nut.

Following below is a description of how the backplanes 7, 11 are prepared for installation in the cabinet 1 and then installed with reference to FIGS. 1 and 2.

In order to prevent plug-in cards 4a inserted into the second backplane 11 from protruding from the cabinet 1 or in other words, in order to ensure that the front plates 4b finish flush with the rear card basket 6, a sufficient distance $s_2$ must exist between the front side 12 of the second backplane 11 and the rear side 3 of the cabinet 1. This requires that the front side 12 of the second backplane 11 is positioned at a certain distance $s_1$ from the front side 2 of the cabinet 1. The distance $s_1$ must therefore correspond to a predetermined value in order to ensure correct seating of the plug-in cards 4a in the rear card basket 6. This value must be calculated in dependence of the dimensions of the cabinet 1, the backplane 7, the plug-in cards 4a and the front plates 4b.

The position of the attachment points for attaching the first backplane 7 to the cabinet 1 is known; it is subject to only small manufacturing tolerances. The thickness K of the backplanes 7, 11 on the other hand, is subject to much higher manufacturing tolerances. This tolerance is about ±10% of the required thickness of the backplanes 7, 11. Since the second backplane 11 is assembled onto the first backplane 7 by means of distance pieces 14, the tolerances regarding the thicknesses K of the backplanes 7, 11 would accumulate without preparatory machining steps on the backplanes 7, 11. As a result there would be too much variation in the distance $s_1$ due to manufacturing tolerances.

In order to compensate for or minimize, this variation routed in the manufacturing process, counterbores 22 are worked into the rear sides 9, 13 of the two backplanes 7, 11 to a depth 23. The depths 23 of the counterbores 22 are chosen such that the distance $s_1$ between the front side 12 of the second backplane 11 and the front 2 of the cabinet 1 corresponds to the calculated predetermined value. This can be accomplished in different ways:

On the one hand the depths 23 of the counterbores 22 can be individually calculated as a function of the dimensions of the cabinet 1, the backplanes 7, 11, the plug-in cards 4a and the front plates 4b. This would involve an increased amount of labor.

On the other hand it is feasible to drill the counterbores 22 into the backplanes 7, 11 to a depth which ensures that a defined residual thickness R of the backplanes 7, 11 remains. The residual thickness R can thus be maintained at a tolerance of ±1%. Thus it is possible to guarantee an overall length G consisting of the residual thicknesses R of the backplanes 7, 11 and a length L of the distance piece 14, at very small tolerances, i.e. tolerances close to 0 mm. As a result the second backplane 11 can be positioned in the cabinet 1 such that the distance $s_1$ corresponds very accurately to a predetermined value. The residual thickness of the backplanes has been previously fixed once and for all as a function of the dimensions of the cabinet, the position of the attachment points for the first backplane and the dimensions of a plug-in module. Since the dimensions of the cabinet are subject to only a small manufacturing tolerance, the once and for all defined residual thickness R can be used for a plurality of cabinets of the same type.

In comparison to the first possibility, i.e. individually determining the depths 23, the second possibility is more cost-effective and therefore preferable. This is because there is less technical effort involved with counterboring up to a residual thickness R of the backplanes 7, 11.

Installation of the two backplanes 7, 11 in the cabinet 1 is effected in that initially, the first backplane 7 is attached in the cabinet 1. After the distance pieces 14 have been screwed to the first backplane 7 so that the contact surfaces 20 of the distance pieces 14 are in contact with the bottom 21 of the counterbores 22 of the first backplane 7, the second backplane 11 is pushed onto and attached to the free ends of the distance pieces 14. During this process the opposing contact surfaces 20 of the distance piece 14 are making contact with the bottom 21 of the counterbores 22 of the second backplane 11. Now the plug-in cards 4a of the plug-in modules 4 can be pushed into the plugs 10 of the second backplanes 7, 11 without having to fear that they might not fit into the space of the rear card basket 6. The front plates 4b of the plug-in modules 4 finish flush with the rear card basket 6 and are connected with the cabinet by means of screw connections, for example.

While exemplary embodiments have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

| LIST OF REFERENCE SYMBOLS | |
|---|---|
| 1 | cabinet |
| 2 | front (cabinet) |
| 3 | back (cabinet) |
| 4 | plug-in module |
| 4a | plug-in card |
| 4b | front plate |
| 5 | front card basket |
| 6 | rear card basket |
| 7 | first backplane |
| 8 | front side (first backplane) |
| 9 | rear side (first backplane) |
| 10 | plug |
| 11 | second backplane |
| 12 | front side (second backplane) |
| 13 | rear side (second backplane) |
| $s_1$ | distance |
| $s_2$ | distance |
| 14 | distance piece |
| 15 | distance bolt |
| 16 | connecting portion |
| 17 | threaded portion |
| 18 | external thread |
| $D_1$ | diameter (threaded portion) |
| $D_2$ | diameter (connecting portion) |
| 19 | shoulders |
| 20 | contact surface |
| 21 | bottom (counterbore) |
| 22 | counterbore |
| 23 | depth |
| 24 | through-hole |
| 25 | contact surface |
| 26 | washer |
| 27 | nut |
| K | thickness (backplane) |
| R | residual thickness (backplane) |
| G | overall length |
| L | length (distance piece) |

What is claimed is:

1. A cabinet for housing electronic plug-in cards, comprising:

a front and a back;

front and rear card baskets for inserting plug-in cards from the front and back of the cabinet, respectively;

first and second vertical backplanes each having a front side and a rear side, wherein the first backplane is attached to the end of the front card basket and the front side of the first backplane faces the front of the cabinet, wherein the second backplane is arranged parallel to and spaced from the rear side of the first backplane and the front side of the second backplane faces the back of the cabinet, the rear sides of the first and second backplanes facing each other;

a distance piece connecting the two backplanes, the distance piece comprising a sleeve through which extends a threaded rod, the threaded rod extending through a through hole in each of the backplanes;

a counterbore disposed in the rear side of one of the first and second backplanes, the counterbore having a depth less than a thickness of the one backplane and defining a bottom surface, the distance between the bottom surface and the front side of the one backplane defining a residual thickness, the bottom surface of the counterbore being contacted by the distance piece;

wherein, the depth of the counterbore or the residual thicknesses of the one backplane after drilling the counterbore is sized such that the distance between the front side of the second backplane and the front of the cabinet is a predetermined value, whereby the plug-in cards pushed onto the second backplane are completely received inside the rear card basket and the front plate of the plug-in cards ends flush with the rear card basket.

2. The cabinet according to claim 1, wherein the counterbore comprises a plurality of counterbores and at least one of the counterbores is disposed on the rear side of each of the first and second backplanes.

3. The cabinet according to claim 2, wherein the distance piece comprises a connecting portion with two circular contact surfaces lying opposite each other for making contact with the facing rear sides of the backplanes.

4. The cabinet according to claim 2, wherein the two backplanes are electrically connected to each other via the distance piece.

5. The cabinet according to claim 2, wherein the through holes in each of the backplanes are disposed concentrically with the counterbores and wherein the concentric through holes have having a diameter that is smaller than the diameter of the counterbores.

6. The cabinet according to one claim 2, wherein the threaded rod comprises a distance bolt having two threaded portions following on from the connecting portion on either side and a diameter which is reduced relative to the connecting portion.

7. The cabinet according to claim 3, wherein the distance piece comprises internal threads at the contact surfaces.

8. The cabinet according to claim 6, wherein the two threaded portions of the threaded rod originate from the rear sides of both backplanes through the through-holes.

9. The cabinet according to claim 7, wherein fastening means are provided, which extend from the front sides of the backplanes, through the through-holes, and engage in the internal threads of the distance piece.

10. A method of assembling a cabinet for housing electronic plug-in cards, the cabinet having a front and a back and front and rear card baskets, the method comprising:

(a) attaching a first backplane to the end of the front card basket so that the front side of the first backplane faces the front of the cabinet;

(b) arranging a second backplane parallel to and spaced from the rear side of the first backplane such that the front side of the second backplane faces the back of the cabinet and the rear sides of the first and second backplanes face one another;

(c) selecting the distance between the front side of the second backplane and the front of the cabinet such that, when the backplanes are assembled in the cabinet, the plug-in cards pushed onto the second backplane are completely received inside the rear card basket and the front plate of the plug-in cards ends flush with the rear card basket;

(d) forming a counterbore in one of the backplanes, the counterbore having a depth less than a thickness of the one backplane and defining a bottom surface, the distance between the bottom surface and the front side of the one backplane defining a residual thickness, the counterbore depth being selected as a function of the distance selected in step (c);

(e) connecting the first and second backplanes with a distance piece, the distance piece comprising a sleeve through which extends a threaded rod, the threaded rod extending through a through hole in each backplane, the distance piece mating with the bottom surface of the counterbore; and (f) plugging the plug-in cards into the front and rear card baskets.

11. The method of claim 10, wherein the distance selected in step (c) is determined as a function of the thickness of one or both backplanes.

12. The method of claim 10, wherein steps (c) and (d) are done as preparatory steps before step (b).

13. The method of claim 10, wherein step (d) further comprises forming a counterbore in each backplane, the distance piece mating with the bottom surfaces of both counterbores.

14. The method of claim 10, wherein the depth selected in step (d) corresponds to a desired residual thickness remaining in the backplane after the counterbore is formed, and wherein the method further comprises using the same desired residual thickness to assemble several of the cabinets.

* * * * *